United States Patent [19]
Hayakawa et al.

[11] Patent Number: 4,759,024
[45] Date of Patent: Jul. 19, 1988

[54] SEMICONDUCTOR LASER DEVICE HAVING AN OSCILLATION WAVELENGTH IN THE VISIBLE SHORT-WAVELENGTH REGION

[75] Inventors: Toshiro Hayakawa, Nara; Takahiro Suyama; Kosei Takahashi, both of Tenri; Saburo Yamamoto, Nara, all of Japan

[73] Assignee: Sharp Kabushiki Kaisha, Osaka, Japan

[21] Appl. No.: 854,248

[22] Filed: Apr. 21, 1986

[30] Foreign Application Priority Data

Apr. 22, 1985 [JP] Japan ................................. 60-85797

[51] Int. Cl.⁴ .............................................. H01S 3/19
[52] U.S. Cl. ........................................ 372/45; 357/16; 357/17; 357/61
[58] Field of Search ...................... 372/44, 45; 357/16, 357/17, 61

[56] References Cited

U.S. PATENT DOCUMENTS 4,644,553 2/1987 Van Ruyven et al. ............... 372/45

FOREIGN PATENT DOCUMENTS 0130878 7/1985 Japan ..................................... 372/45

*Primary Examiner*—James W. Davie
*Attorney, Agent, or Firm*—Armstrong, Nikaido, Marmelstein & Kubovcik

[57] ABSTRACT

A semiconductor laser device comprises a superlatticed layer which is composed of alternate layers consisting of GaP thin layers and AlP thin layers. The superlatticed layer is formed as an active layer on a GaP substrate. The semiconductor laser device also is composed of two superlatticed cladding layers formed on either side of the active layer. The laser device of the present invention has an oscillation wavelength in the visible short-wavelength region.

5 Claims, 1 Drawing Sheet

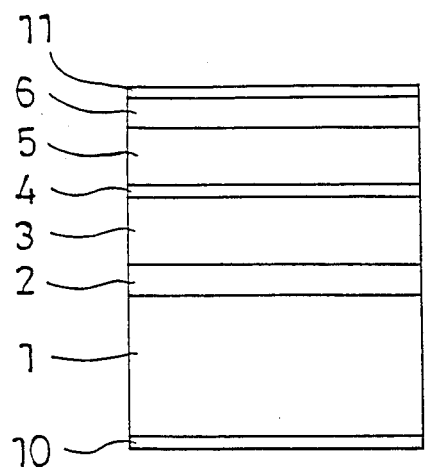

SEMICONDUCTOR LASER DEVICE HAVING AN OSCILLATION WAVELENGTH IN THE VISIBLE SHORT-WAVELENGTH REGION

BACKGROUND OF THE INVENTION

1. Field of the Invention

This invention relates to a semiconductor laser device having an oscillation wavelength in the visible short-wavelength region.

2. Description of the Prior Art

Since GaAlAs semiconductor lasers having an oscillation wavelength in the 780 nm zone have been put into actual use for the play of compact discs, visible semiconductor lasers having an oscillation wavelength in the visible short-wavelength region have been widely applied to video discs, laser beam printers, etc., wherein gas lasers such as He-Ne laser, Ar-ion lasers, etc., are used as a light source. In order to improve the capabilities of a system including such lasers devices, the development of semiconductor lasers oscillating at a short-wavelength is required.

In recent years, using direct transition semiconductor laser materials which can oscillate at an oscillation wavelength of 632.8 nm, an InGaAlP mixed crystal oscillating at 626.2 nm at ambient temperatures was developed by K. Kobayashi, I. Hino, and T. Suzuki, which is described in Appl. Phys. Lett., vol. 46, p7 (1985).

However, there have not been semiconductor laser materials that can oscillate green light near an oscillation wavelength of 514.5 nm at which Ar-lasers oscillate. In order to attain laser oscillation in the short-wavelength region by a bulk crystal, direct-transition materials having a wide forbidden bandgap are required. The direct-transition materials are, for example, those in the III-V groups such as GaN, AlGaN, etc., and those in the II-VI groups such as ZnSe, ZnS, etc. However, p-crystals having a low electrical resistance cannot be obtained therefrom and the crystallization thereof is inferior, so that semiconductor lasers obtained therefrom attain light emission with a low efficiency. Thus, materials from the above-mentioned II-VI groups and III-V groups are not suitable as semiconductor laser materials.

SUMMARY OF THE INVENTION

The semiconductor laser device of this invention, which overcomes the above-discussed and numerous other disadvantages and deficiencies of the prior art, comprises a superlatticed layer which is composed of alternate layers consisting of GaP thin layers and AlP thin layers, the superlatticed layer being formed as an active layer on a GaP substrate.

The semiconductor laser device comprises superlatticed cladding layers, each of which is, in a preferred embodiment, composed of alternate layers consisting of GaP thin layers and AlP thin layers, the superlatticed cladding layers sandwiching the superlatticed active layer therebetween.

Alternatively, each of the superlatticed cladding layers can be composed of alternate layers consisting of $Ga_{1-x}Al_xP$ thin layers and AlP or GaP thin layers, the superlatticed cladding layers sandwiching its superlatticed active layer therebetween. Each of the superlatticed cladding layers can also be composed of a $Ga_{1-x}Al_xP$ mixed crystal, the cladding layer sandwiching the superlatticed active layer therebetween.

Thus, the invention described herein makes possible the objects of (1) providing a novel semiconductor laser device which has an oscillation wavelength of less than 600 nm; (2) providing a novel semiconductor laser device in which crystal layers lattice-matched therebetween are epitaxially grown on a good quality substrate, resulting in a good quality laser crystal on the substrate; and (3) providing a novel semiconductor laser device in which the GaAlP crystal containing only Ga and Al as an element of group III, unlike InGaAlP mixed crystals used for conventional semiconductor laser devices oscillating in the 600 nm zone, is used as a semiconductor laser material and in which a lattice mismatch between AlP and GaP does not arise, so that the GaAlP crystal can be easily grown by molecular beam epitaxy (MBE), metal-organic chemical vapor deposition (MO-CVD), etc.

BRIEF DESCRIPTION OF THE DRAWING

This invention may be better understood and its numerous objects and advantages will become apparent to those skilled in the art by reference to the accompanying drawing as follows:

The figure is a side view showing a visible semiconductor laser device of this invention.

DESCRIPTION OF THE PREFERRED EMBODIMENTS

The figure shows a visible semiconductor laser device of this invention, which is fabricated as follows: On a GaP substrate 1, a Si-doped n-GaP buffer layer ($n \leq 1 \times 10^{18}$ cm$^{-3}$) 2 having a thickness of 0.5 μm, a superlatticed cladding layer 3 having a thickness of 1 μm which is composed of alternate layers consisting of two hundred Si-doped n-AlP layers ($n \leq 1 \times 10^{18}$ cm$^{-3}$; the thickness of each layer being 40 Å) and two hundred Si-doped n-GaP layers ($n \leq 1 \times 10^{18}$ cm$^{-3}$; the thickness of each layer being 10 Å), a superlatticed active layer 4 having a thickness of 600 Å which is composed of alternate layers consisting of twenty non-doped AlP layers (the thickness of each layer being 10 Å) and twenty non-doped GaP layers (the thickness of each layer being 20 Å), a superlatticed cladding layer 5 having a thickness of 1 μm which is composed of alternate layers consisting of two hundred Be-doped p-AlP layers ($p \leq 1 \times 10^{18}$ cm$^{-3}$; the thickness of each layer being 40 Å) and two hundred Be-doped p-GaP layers ($p \leq 1 \times 10^{18}$ cm$^{-3}$; the thickness of each layer being 10 Å), and a Be-doped p-GaP cap layer ($p \leq 1 \times 10^{18}$ cm$^{-3}$) 6 having a thickness of 0.5 μm are successively grown by molecular beam epitaxy. Then, an n-sided Au-Ge/Ni/Au electrode 10 and a p-sided Au-Zn electrode 11 are formed on the back face of the substrate 1 and the upper face of the cap layer 6, respectively, resulting in a semiconductor laser device.

The semiconductor laser device obtained above attained laser oscillation at a threshold current density of 10 KA/cm$^2$ at a wavelength of 520 nm. The binary compounds, AlP and GaP, constituting the superlatticed active layer 4 has a light emission efficiency of as low as 1% or less because they are naturally indirect transition semiconductor materials. However, once they are incorporated into a superlatticed structure, their band structure changes from an indirect transition type to a direct transition type and moreover the exciton recombination therein is improved, and accordingly their light emission efficiency is increased by one or two orders of magnitude or more. Thus, the resulting semiconductor laser device can achieve laser oscillation. When the active layer is formed into a superlattice which is composed of alternate layers consisting of n number of AlP-molecular layers and m number of GaP-molecular layers (wherein (n,m)=(1,1), (1,2), (1,3), etc.) by molecular beam epitaxy in which the growth of molecular layers is controlled by means of the RHEED intensity oscillation, the dispersion of light emission wavelengths due to fluctuation of the superlattice is suppressed, and accordingly the light emission efficiency at a specific wavelength is further improved, causing a decrease in the threshold current level.

The essential advantages of the above-mentioned semiconductor laser device are as follows. First, since GaP having a low dislocation density can be used as a substrate, the semiconductor laser crystals which are grown on the GaP substrate should also be good quality crystals having a low dislocation density. Although GaP substrates which are presently used for light emitting diodes have a higher dislocation density than GaAs and/or InP substrates which are presently used for lasers, they will be able to have a lower dislocation density by the improvement of a substrate-preparation technique in the future. Secondly, since not only the GaP crystal but also the AlP crystal attain an excellent lattice match with the GaP substrate, an AlP/GaP superlattice and/or an AlGaP mixed crystal have no stress therein and deterioration due to laser oscillation does not occur, resulting in a highly reliable semiconductor laser device.

In the above-mentioned example, the cladding layers 3 and 5 are composed of a AlP/GaP superlattice, but they are not limited thereto. These layers can be composed of a AlGaP mixed crystal, an example of which is a Si-doped n-Al$_{0.8}$Ga$_{0.2}$P (n≦1×10$^{18}$ cm$^{-3}$) 3 having a thickness of 1 μm and a Be-doped p-Al$_{0.8}$Ga$_{0.2}$P (p≦1×10$^{18}$ cm$^{-3}$) 5 having a thickness of 1 μm. Another example of the cladding layer 3 is a superlatticed n-AlP/n-AlGaP layer having a thickness of 1.2 μm, which is composed of alternate layers consisting of four hundred Si-doped n-AlP layers (n≦1×10$^{18}$ cm$^{-3}$; the thickness of each layer being 20 Å) and four hundred Si-doped n-Al$_{0.5}$Ga$_{0.5}$P layers (n≦1×10$^{18}$ cm$^{-3}$; thickness of each layer being 10 Å), and another example of the cladding layer 5 is a superlattice p-AlP/p-AlGaP layer having a thickness of 1.2 μm, which is composed of alternate layers consisting of four hundred Be-doped p-AlP layers (p≦1×10$^{18}$ cm$^{-3}$; the thickness of each layer being 20 Å) and four hundred Be-doped p-Al$_{0.5}$Ga$_{0.5}$P layers (p≦1×10$^{18}$ cm$^{-3}$; the thickness of each layer being 10 Å).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser device comprising:
   a GaP substrate;
   a superlatticed layer which is composed of alternate layers consisting of GaP thin layers and AlP thin layers, said superlatticed layer being formed as an active layer on said GaP substrate; and
   superlatticed cladding layers, each of which is composed of alternate layers consisting of GaP thin layers and AlP thin layers, said superlatticed cladding layers sandwiching said superlatticed active layer therebetween.

2. A semiconductor laser device according to claim 1, wherein each superlatticed cladding layers is composed of alternate layers consisting of Ga$_{1-x}$Al$_x$P thin layers and AlP or GaP thin layers.

3. A semiconductor laser device according to claim 1, wherein each superlatticed cladding layers is composed of a Ga$_{1-x}$Al$_x$P mixed crystal.

4. A semiconductor laser device comprising:
   a GaP substrate;
   a buffer layer formed on said substrate;
   a first superlatticed cladding layer composed of alternate superlatticed layers consisting of GaP thin layers, said first cladding layer being and AlP thin layers, said first superlatticed cladding layer being formed on said buffer layer;
   a superlatticed layer which is composed of alternate layers consisting of GaP thin layers and AlP thin layers, said superlatticed layer being formed as an active layer on said first superlatticed cladding layer;
   a second superlatticed cladding layer composed of alternate layers consisting of GaP thin layers and AlP thin layers, said first and second superlatticed cladding layers sandwiching said superlatticed active layer therebetween;
   a cap layer formed on said second cladding layer; and
   first and second electrodes formed on a back face of said substrate and an upper face of the cap layer.

5. A semiconductor laser device comprising:
   a GaP substrate;
   a superlatticed layer which is composed of alternate layers consisting of GaP thin layers and AlP thin layers, said GaP thin layers being twice as thick as said AlP thin layers, said superlatticed layer being formed as an active layer on said GaP substrate;
   superlatticed cladding layers, each of which is composed of alternate layers consisting of GaP thin layers and AlP thin layers, said AlP thin layers being four times as thick as said GaP thin layers, said superlatticed cladding layers sandwiching said superlatticed active layer therebetween.

* * * * *